United States Patent
Lin et al.

(10) Patent No.: US 9,307,664 B2
(45) Date of Patent: Apr. 5, 2016

(54) ZERO POWER CONSUMPTION CONNECTOR FOR POWER ADAPTER AND POWER CONNECTOR

(71) Applicant: HON HAI PRECISION INDUSTRY CO., LTD., New Taipei (TW)

(72) Inventors: Yi-Min Lin, New Taipei (TW); Chun-Fu Wu, New Taipei (TW); I-Fan Chung, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 265 days.

(21) Appl. No.: 13/972,943

(22) Filed: Aug. 22, 2013

(65) Prior Publication Data

US 2014/0055931 A1   Feb. 27, 2014

(30) Foreign Application Priority Data

Aug. 24, 2012  (TW) ............................. 101130908 A

(51) Int. Cl.
*H05K 7/00* (2006.01)
*H01R 13/703* (2006.01)
*H01R 24/58* (2011.01)

(52) U.S. Cl.
CPC .............. *H05K 7/00* (2013.01); *H01R 13/7037* (2013.01); *H01R 24/58* (2013.01)

(58) Field of Classification Search
CPC ....... H05K 7/00; H01R 13/7037; H01R 24/58
USPC .......................................... 335/285–290, 295
See application file for complete search history.

(56) References Cited

U.S. PATENT DOCUMENTS

| | | | | |
|---|---|---|---|---|
| 6,183,264 B1* | 2/2001 | Harsanyi | ............ | H01R 13/7037 438/39 |
| 6,966,781 B1* | 11/2005 | Bullinger | ........... | H01R 13/6205 439/289 |
| 7,351,066 B2* | 4/2008 | DiFonzo | .............. | H01R 13/641 439/39 |
| 7,726,973 B1 | 6/2010 | Perry | | |
| 8,300,442 B2* | 10/2012 | Wang | ...................... | H02M 1/00 363/146 |
| 8,947,185 B2* | 2/2015 | Fullerton | ................ | E05C 19/16 335/285 |
| 2011/0157939 A1 | 6/2011 | Wang et al. | | |
| 2011/0304415 A1 | 12/2011 | Ho | | |

FOREIGN PATENT DOCUMENTS

| | | |
|---|---|---|
| CN | 101090179 A | 12/2007 |
| TW | M392490 U1 | 11/2010 |
| TW | M403687 U1 | 5/2011 |

* cited by examiner

*Primary Examiner* — Bernard Rojas
(74) *Attorney, Agent, or Firm* — Novak Druce Connolly Bove + Quigg LLP

(57) ABSTRACT

A power adapter between an alternating current (AC) source and an external direct current (DC) consumer device consumes no electrical power until the DC device is connected to the power adapter. The power adapter includes a first magnet, a second magnet which is repelled by the first magnet, and a movable conductive member arranged on the second magnet. The insertion of the external DC device pushes the second magnet towards the first magnet and establishes a connection between the AC power source and the power adaptor. When the external device is removed, the movable conductive member is driven away by a repulsive force between the magnets to disconnect the external AC power source from the power adapter.

14 Claims, 4 Drawing Sheets

ZERO POWER CONSUMPTION CONNECTOR FOR POWER ADAPTER AND POWER CONNECTOR

CROSS-REFERENCE TO RELATED APPLICATION

This application claims priority to Taiwan Patent Application No. 101130908, filed on Aug. 24, 2012, the contents of all of which are incorporated herein by reference in their entirety.

BACKGROUND

1. Technical Field

The disclosure relates to power apparatuses, and particularly to a power adapter and a power connector.

2. Description of Related Art

Power connectors (e.g., power adapters) connect electronic devices to a power supply, to supply power to the electronic devices. Most of the power connectors consume a small amount of electricity even if no electronic device is connected to the power connectors, which wastes energy. Therefore, there is room for improvement in the art.

BRIEF DESCRIPTION OF THE DRAWINGS

The accompanying drawings are included to provide a better understanding of the disclosure, and are incorporated in and constitute a part of this application. The drawings illustrate embodiments of the disclosure and, together with the description, serve to explain the principles of the disclosure.

DETAILED DESCRIPTION

Figure 1:
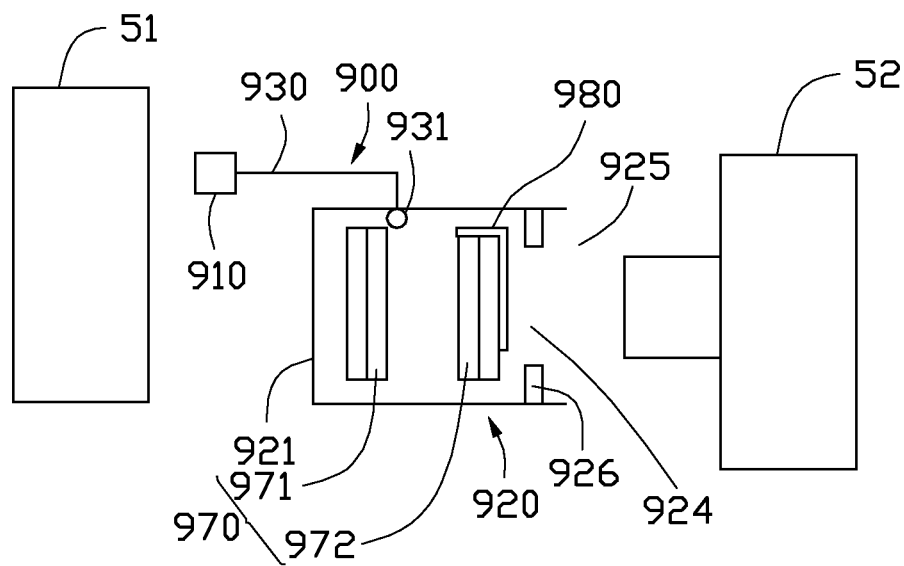
FIG. 1 is a schematic view of one embodiment of a power connector connecting an electronic device and a power supply.

Examples of the present embodiments are illustrated in the accompanying drawings. Wherever possible, the same or similar reference numbers are used, in the drawings and the description, to refer to the same or like parts.

Referring to FIG. 1, a power connector 900 is configured to electrically connect a first device 51 and a second device 52, to transmit electrical power therebetween. In the embodiment, the first device 51 may be a power source (e.g., a movable power supply device). The second device 52 may be an electronic device (e.g., a mobile phone or other device). In the embodiment, the power connector 900 includes a connection port 910, a main portion 920, and an electrical wire 930 connected between the connection port 910 and the main portion 920. The connection port 910 is configured to connect to the first device 51. The main portion 920 is configured to connect to the second device 52. The electrical wire 930 includes a connection terminal 931 and a movable conductive member 980.

The main portion 920 includes an insulating holding body 921 having a switch 970 within an inner space of the insulating holding body 921. The insulating holding body 921 defines a receiving space 924 for receiving the switch 970. The receiving space 924 has an opening 925. The second device 52 is electrically connected to the power connector 900 by insertion partial of the second device 52 in the opening 925. The insulating holding body 921 defines two protrusions 926 protruding from opposite inner sidewalls of the insulating holding body 921, respectively, and the two protrusions 926 protruding from the insulating holding body 921 forms an open end of the receiving space 924. The connection terminal 931 of the electrical wire 930 is fixed on an inner sidewall of the insulating holding body 921 and spaced a certain distance from one of the protrusions 926. The switch 970 includes a first magnet 971 and a second magnet 972. The first magnet 971 and the second magnet 972 are arranged to repel each other. The second magnet 972 is arranged at a side of the first magnet 971 adjacent to the opening 925. The protrusions 926 prevent the second magnet 972 from moving out of the receiving space 924. The connection terminal 931 is arranged adjacent to the first magnet 971, and the movable conductive member 980 is located above the second magnet 972. At rest, the movable conductive member 980 is disconnected and distanced from the connection terminal 931 due to repulsion between the first magnet 971 and the second magnet 972. When a portion of the second device 52 is inserted into the insulating holding body 921 through the open end of the receiving space 924 and inserted into the inner space of the insulating holding body 921, the second magnet 972 is pushed to drive the movable conductive member 980 to connect with the connection terminal 931. Then, the main portion 920 receives power from the first device 51 and the main portion 920 starts working, and power is transmitted from the first device 51 to the second device 52. When the second device 52 is moved out of the receiving space 924, the repulsion between the first magnet 971 and the second magnet 972 drives the movable conductive member 980 away, to disconnect the movable conductive member 980 from the connection terminal 931. Thereupon, the main portion 920 stops working because of the lack of power.

The main portion 920 of the power connector 900 is thus activated only when the second device 52 is inserted into the inner space of the main portion 920, and energy waste is avoided.

Figure 2:
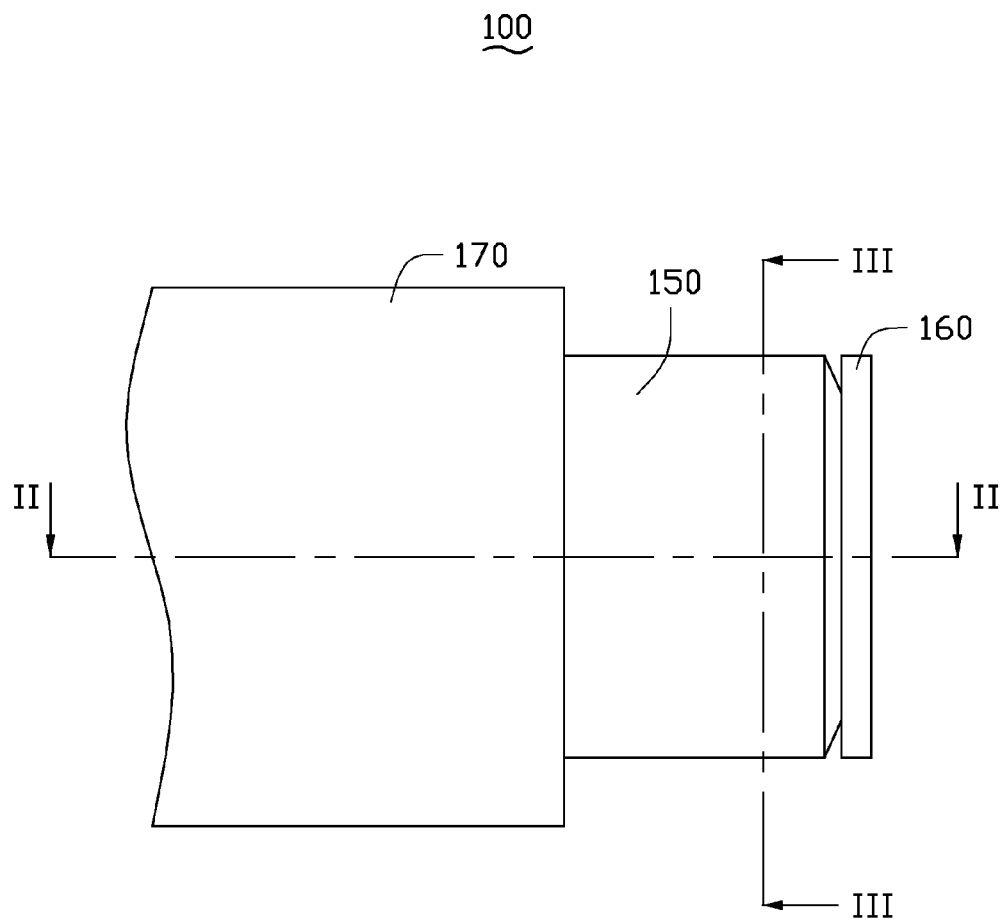
FIG. 2 is a plan view of a power adapter according to an exemplary embodiment.
Figure 3:
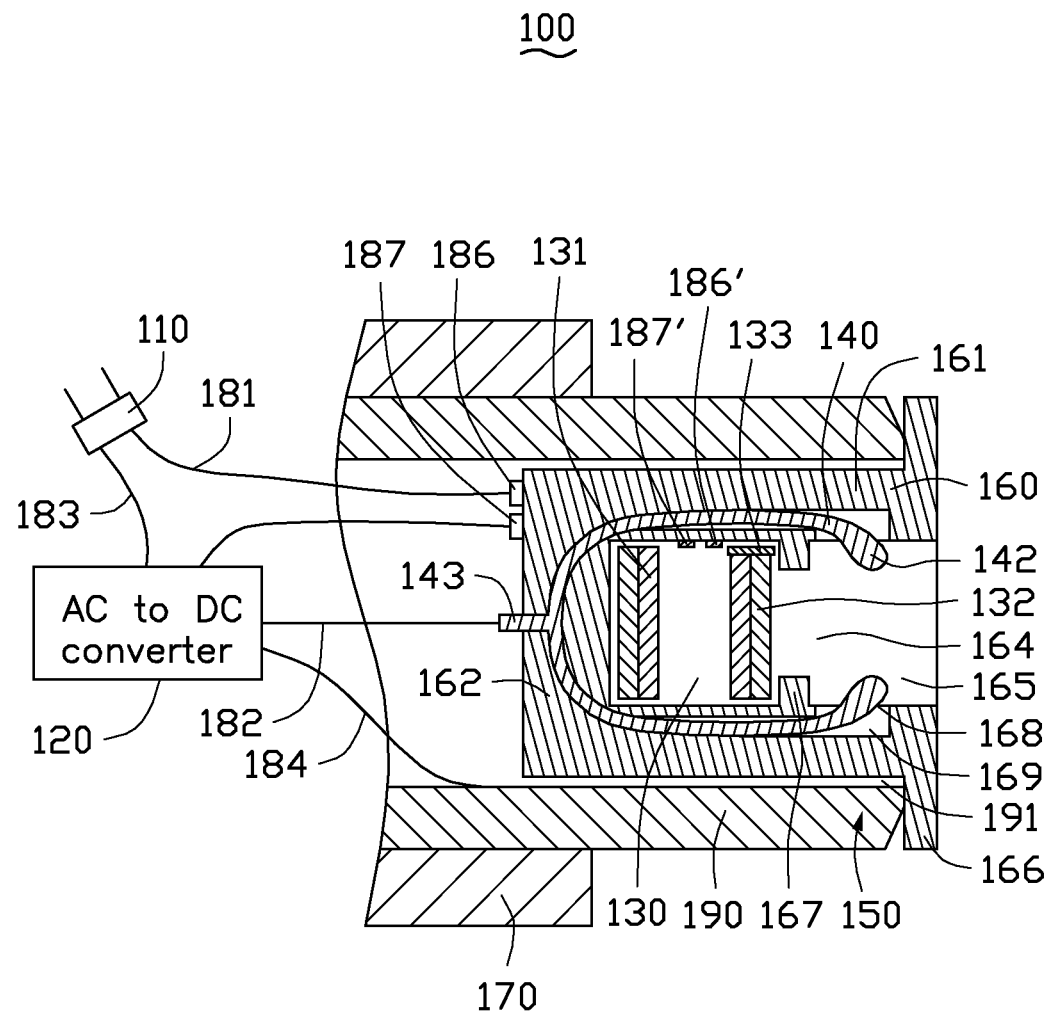
FIG. 3 is a cross-sectional view of the power adapter along II-II line of FIG. 2.
Figure 4:
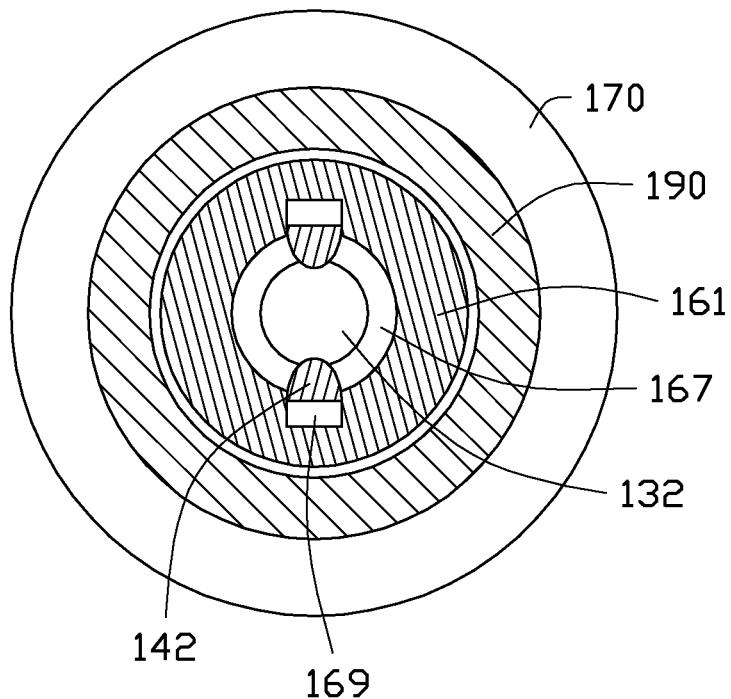
FIG. 4 is a cross-sectional view of the power adapter along III-III line of FIG. 2.

Referring to FIG. 2 to FIG. 4, a power adapter 100 according to an exemplary embodiment is shown. The power adapter 100 is configured to convert alternating current (AC) into direct current (DC) to power other electronic devices (not shown). The power adapter 100 includes a plug 110, an AC to DC converter 120, a switch 130, a DC output member 150, a first electrical wire 181, and a second electrical wire 182. The first electrical wire 181 is electrically connected between the AC to DC converter 120 and the plug 110. The second electrical wire 182 is electrically connected between the AC to DC converter 120 and the DC output member 150. In the embodiment, the AC to DC converter 120 converts external AC input from the plug 110 into DC, and outputs the DC via the DC output member 150 to other electronic devices.

In the embodiment, the power adapter 100 further includes a third electrical wire 183 and a fourth electrical wire 184. The third electrical wire 183 is also electrically connected between the plug 110 and the AC to DC converter 120. The first and third electrical wires 181, 183 carry live and neutral supplies. Particularly, the first electrical wire 181 is a live wire and the third electrical wire 183 is a neutral wire. The fourth electrical wire 184 is a ground line. The first electrical wire 181 includes a first terminal 186 and a second terminal 187 which are normally connected with each other when an external device is connected to the DC output member 150. When no external device is connected to the DC output member, the first terminal 186 and the second terminal 187 are disconnected and spaced from each other. The first electrical wire 181 is divided into two disconnected portions by the first and second terminals 186, 187. The switch 130 controls the connection and disconnection between the first terminal 186 and second terminal 187.

The power adapter 100 further includes a first shell 170 made of plastic, which is configured to house the DC output member 150 and electrical wires connected to the DC output member 150. A portion of the DC output member 150 extends out of the first shell 170 to connect to external devices (not shown), thus supplying power for the external devices. In the embodiment, the switch 130 is accommodated within an inner space of the DC output member 150.

The DC output member 150 includes a second shell 190, a holding structure 160, and a conductive element 140. The holding structure 160 accommodates the conductive element 140, and a portion of the holding structure 160 is accommodated in the second shell 190. The second shell 190 is made of electrically conductive materials, and a portion of the second shell 190 is accommodated within the first shell 170. The second shell 190 defines a first opening 191 away from the first shell 170. The second shell 190 is electrically connected to the fourth electrical wire 184, and is connected to the ground via the fourth electrical wire 184. In the embodiment, the second shell 190 is columnar and has a column shaped receiving space. Most of the holding structure 160 is accommodated in the receiving space of the second shell 190.

The holding structure 160, including a sidewall 161 and a bottom wall 162, is made of insulating materials. The sidewall 161 and the sidewall 162 corporately form a first receiving space 164 to receive the switch 130. The bottom wall 162 is located at an inner side of the second shell 190 away from the first opening 191. In the embodiment, the sidewall 161 and the bottom wall 162 corporately form a column shaped structure. A resisting wall 166 extending towards the DC output member 150 is defined on the sidewall 161, to resist a side of the second shell 190 where the first opening 191 is formed. The first receiving space 164 defines a second opening 165 at a side away from the bottom wall 162. The holding structure 160 further includes a second receiving space 169 which is formed in the sidewall 161 and the bottom wall 162 and partially surrounds the first receiving space 164. The second receiving space 169 accommodates the conductive element 140. A through hole 168 is formed adjacent to the second opening 165 to communicate between the first receiving space 164 and the second receiving space 169. The sidewall 161 defines at least one protrusion 167 to fix the switch 130 within the first receiving space 164. The through hole 168 is defined at a side of the at least one protrusion 167 adjacent to the second opening 165, and the protrusion 167 protruding from the holding structure 160 forms an open end. An end 186' of the first terminal 186 and an end 187' of the second terminal 187 extend into the first receiving space 164 through the sidewall 161. The ends 186' and 187' are positioned between the bottom wall 162 and the at least one protrusion 167.

The conductive element 140 includes a body (not labeled), and a first contact end 142 and a second contact end 143 located at opposite ends of the body. The first contact end 142 extends into the first receiving space 164 through the through hole 168. The second contact end 143 passes through the bottom wall 162 and extends out of the holding structure 160, to be electrically connected to the AC to DC converter. In the embodiment, the conductive element 140 may be integrated with the holding structure 160, and exposed at the through hole 168. The conductive element 140 is electrically insulated from the second shell 190.

The switch 130 includes a first magnet 131 and a second magnet 132, which are arranged to repel each other. A movable conductive member 133 is arranged on the second magnet 131. In the embodiment, the movable conductive member 133 is a made of conductive materials. The first magnet 131 is fixed on the bottom wall 162. The at least one protrusion 167 prevents the second magnet 132 from moving out of the first receiving space 164.

In use, the plug 110 is connected to an external power source (e.g., a 110V AC source) and an external device is inserted into the first receiving space 164 through the second opening 165, thus the first contact end 142 is electrically connected to the external device. Then, the external device is inserted into the inner space through the open end and forces the second magnet 132 to move until the movable conductive member 133 on the second magnet 132 is electrically connected between the first end 186' of the first terminal 186 and the second end 187' of the second terminal 187. Thereby, power from the external power source is transmitted to AC to DC converter 120 through the first electrical wire 181, because the first terminal 186 and the second terminal 187 of the first electrical wire 181 are electrically connected to each other through the movable conductive member 133.

When the external device is moved out of the first receiving space 164, the movable conductive member 133 is driven away by the repulsion between the first magnet 131 and the second magnet 132 and so disconnects from the first end 186' and the second end 187'. Thereupon, the external power source cannot pass power to the AC to DC converter 120, and the AC to DC converter 120 stops working. Therefore, the AC to DC converter 120 of the power adapter 100 works only when the external device is inserted into the inner space of the DC output member 150, and energy waste is avoided.

Although numerous characteristics and advantages of the present embodiments have been set out in the foregoing description, together with details of the structures and functions of the embodiments, the disclosure is illustrative only; and changes may be made in detail, especially in the matters of shape, size and arrangement of parts within the principles of the disclosure to the full extent indicated by the broad general meaning of the terms in which the appended claims are expressed.

What is claimed is:

1. A power adapter, comprising:
a plug configured to connect to an external power source;
an AC to DC converter configured to convert alternating current (AC) from the external power source into direct current (DC);
a DC output member configured to output the DC to an external device to power the external device, wherein the DC output member comprises a holding structure, and the holding structure comprises at least one protrusion extending from the holding structure, and the protrusion protruding from the holding structure forms an open end;
a first electrical wire configured to electrically connect the AC to DC converter to the plug, the first electrical wire comprising a first terminal and a second terminal, the first terminal normally connected to the second terminal when the external device is connected to the DC output member and disconnected from the second terminal when the external device is not connected to the DC output member; and
a switch arranged within an inner space of the DC output member, the switch comprising a first magnet, a second magnet, and a movable conductive member arranged on the second magnet, the first magnet and the second magnet arranged to repel each other;

wherein an end of the first terminal and an end of the second terminal extend into the inner space of the DC output member; wherein the external device is inserted into the inner space through the open end, the second magnet is pushed by the external device and moved away from the protrusion until the movable conductive member is electrically connected between the end of first terminal and the end of the second terminal, and power from the external power source is transmitted to the AC to DC converter through the first electrical wire.

2. The power adapter as claimed in claim 1, wherein when the external device is moved out of the inner space of the DC output member, the movable conductive member is driven away by a repulsion between the first magnet and the second magnet such that the movable conductive member disconnects from the ends of first and second terminals.

3. The power adapter as claimed in claim 1, wherein the holding structure has a first receiving space for accommodating the switch.

4. The power adapter as claimed in claim 3, wherein the ends of the first and second terminals pass through a sidewall of the holding structure to extend into the first receiving space.

5. The power adapter as claimed in claim 4, wherein the first receiving space defines an opening, and the external device is inserted into the DC output member through the opening.

6. The power adapter as claimed in claim 5, wherein the protrusion extends from the sidewall of the holding structure, the first and second magnets are arranged within the first receiving space, the second magnet is arranged at a side of the first magnet adjacent to the opening, and the at least one protrusion prevents the second magnet from moving out of the first receiving space.

7. The power adapter as claimed in claim 6, wherein the DC output member further comprises a conductive element having a body, and a first contact end and a second contact end located at opposite ends of the body; the holding structure further defines a second receiving space surrounding the first receiving space; a through hole is formed adjacent to the opening to communicate between the first receiving space and the second receiving space; the first contact end extends into the first receiving space through the through hole, and the second contact end extends out of the holding structure to electrically connect to the AC to DC converter.

8. The power adapter as claimed in claim 7, wherein when the external device is inserted into the inner space of the DC output member via the opening, the external device is electrically connected to the first contact end.

9. The power adapter as claimed in claim 8, further comprising a first shell, the DC output member comprising a second shell, wherein the second shell is insulating relative to the conductive element, a part of the DC output member is accommodated within the first shell and another part of the DC output member extends out of the first shell to connect with the external device, and the holding structure is accommodated within the second shell.

10. The power adapter as claimed in claim 9, wherein the holding structure comprises a bottom wall and a sidewall corporately form the first receiving space, the first magnet is fixed at the bottom wall, the first receiving space has an opening away from the bottom, and the through hole is defined at a side of the protrusion adjacent to the opening of the first receiving space.

11. A power connector for electrically connecting an electronic device to a power source, comprising:
    a connection port configured to connect to the power source;
    a main portion configured to connect to the electronic device; and
    an electrical wire connected between the connection port and the main portion, the electrical wire comprising a connection terminal and a movable conductive member;
    wherein the main portion comprises an insulating holding body having a switch within an inner space of the insulating holding body, the switch comprises a first magnet and a second magnet which are arranged to repel each other, the movable conductive member is arranged on the second magnet; wherein the insulating holding body defines a receiving space, and two protrusions protruding from the insulating holding body form an open end of the receiving space, wherein a portion of the second device is inserted into the inner space of the insulating holding body through the open end of the receiving space, the second magnet is forced by the external device and moved away from the two protrusions to drive the movable conductive member to connect with the connection terminal, and power from the power source is transmitted to the electronic device.

12. The power connector as claimed in claim 11, wherein when the electronic device is moved out of the inner space of the insulating holding body, the movable conductive member is driven away by repulsion between the first magnet and the second magnet and disconnects from the connection terminal.

13. The power connector as claimed in claim 11, wherein inner sidewalls of the insulating holding structure has an opening to receive the switch, and the connection terminal is fixed on an inner sidewall of the insulating holding body and spaced a certain distance from the movable conductive member.

14. The power connector as claimed in claim 13, wherein the two protrusions protrudes from opposite inner sidewalls of the insulating holding body, respectively, the first magnet is arranged within the receiving space, the second magnet is arranged at a side of the first magnet adjacent to the opening, and the two protrusions prevent the second magnet from moving out of the receiving space.

* * * * *